United States Patent [19]
Vilela et al.

[11] Patent Number: 5,800,630
[45] Date of Patent: Sep. 1, 1998

[54] TANDEM SOLAR CELL WITH INDIUM PHOSPHIDE TUNNEL JUNCTION

[75] Inventors: Mauro F. Vilela; Abdelhak Bensaoula; Alexandre Freundlich; Philippe Renaud; Nasr-Eddine Medelci, all of Houston, Tex.

[73] Assignee: University of Houston, Houston, Tex.

[21] Appl. No.: 349,601

[22] Filed: Dec. 5, 1994

Related U.S. Application Data

[63] Continuation-in-part of Ser. No. 44,941, Apr. 8, 1993, Pat. No. 5,407,491.

[51] Int. Cl.$^6$ .................... H01L 31/068; H01L 31/18
[52] U.S. Cl. .................... 136/249; 257/440; 438/74; 438/93; 438/95
[58] Field of Search .................... 136/249 TJ; 257/104, 257/440, 615; 437/5, 107; 438/74, 93, 95

[56] References Cited

U.S. PATENT DOCUMENTS

| | | | |
|---|---|---|---|
| 4,278,473 | 7/1981 | Borden | 136/249 MS |
| 4,278,474 | 7/1981 | Blakeslee | 136/249 TJ |
| 5,008,718 | 4/1991 | Fletcher | 257/96 |
| 5,009,719 | 4/1991 | Yoshida | 136/249 TJ |
| 5,019,177 | 5/1991 | Wanlass | 136/249 TJ |
| 5,322,572 | 6/1994 | Wanlass | 136/249 |

OTHER PUBLICATIONS

Shen, C.C., P.T. Chang and K.Y. Choi, "An $In_{0.53}Ga_{0.47}As$ Tunnel Diode for Monolithic Multijunction Solar Cell Application, " 1988 IEEE, pp. 771–776.

Shen, C.C. and P.T. Chang, "Two–Terminal Monolithic InP/InGaAsp Tantem Solar Cells with Tunneling Intercell Ohmic Connections," 1991 IEEE, pp. 381–387.

Nordwall, Bruce D., "Satellite to Probe Solar Cell Damage From Space Plasma and Radiation," *Aviation Week & Space Technology*, Feb. 17, 1992.

Zorpette, Glenn, "Photovoltaics: technical gains and an uncertain market," *IEEE Spectrum*, Jul. 1989, pp. 42–43.

Yates, Marshall, "House Approves Energy Spending Bill," *Public Utilities Fortnightly*, Jul. 19, 1990, pp. 40–41.

"USAF Funding R&D to Design More Effiecient Solar Cells," *Aviation Week & Space Technology*, Apr. 10, 1989, pp. 81, 85.

Miller, William H., "Back Into the Sunshine," *Industry Week*, Feb. 4, 1991, pp. 52–56.

Greenberger, Leonard S., "SCE Reveals Promising Solar Technology," *Public Utilities Fortnightly*, May 15, 1977. (year not known).

Tyner, John T., "Desert Tortoises Drive 220–kV Line Construction Skyward," *Transmission & Distribution*, Spet. 1991, pp. 28–30.

Annan, Robert H., "Photovoltaic solar approaches role as peaking power producer," *Power Engineering*, Apr. 1989.

Rosen, Jerome, "Solar Furnaces: Concentrating 100,000 Suns," *Mechanical Engineering*, Feb. 1991, pp. 42–46.

Ashley, Steven, "Solar Photovoltaics: Out of the Lab and onto the Production Line," *Mechanical Engineering*, Jan. 1992.

*Primary Examiner*—Aaron Weisstuch
*Attorney, Agent, or Firm*—Hutcheson and Grundy

[57] ABSTRACT

A monolithic, tandem photovoltaic device is provided having an indium phosphide tunnel junction lattice-matched to adjoining subcells and having high peak current densities and low electrical resistance. A method is provided for relatively low-temperature epitaxial growth of a tunnel junction and a subcell over the tunnel junction at temperatures which leave intact the desirable characteristics of the tunnel junction.

21 Claims, 4 Drawing Sheets

□ RATE=1/h, Tg=783K   ○ RATE=0.75/h, Tg=828K
△ RATE=0.75/h, Tg=783K   + RATE=0.75/h, Tg=763K

□ RATE=1/h   ▽ RATE=0.75/h

TANDEM SOLAR CELL WITH INDIUM PHOSPHIDE TUNNEL JUNCTION

This is a continuation-in-part of application Ser. No. 08/044,941, filed Apr. 8, 1993, now U.S. Pat. No. 5,407,491.

SPECIFICATION

1. Field of the Invention

This invention provides an improved tandem solar cell and method of fabrication. More particularly, a two-terminal multi-cell monolithic photovoltaic device is provided by formation of an indium phosphide tunnel junction between tandem subcells.

2. Background of the Invention

Efforts to improve the efficiency of photovoltaic devices, which are used to convert solar energy to electrical energy, are widely supported. The cost of producing electrical power from solar energy has continued to decline in recent years as a result of these efforts and the market for solar cells has increased as the cost of producing electrical power has declined. Most of the solar cells now on the market are made of silicon, but higher efficiency cells from other materials have been investigated in recent years. Particular interest has been focused on gallium arsenide and related alloys and, more recently, on indium phosphide and related alloys. One of the important properties of indium phosphide is its resistance to radiation damage. This property is particularly advantageous in solar cells for space application, but it leads to long-lived and efficient cells for terrestrial applications as well.

Means of concentrating solar energy onto solar cells for terrestrial applications are also being developed. Intensities of hundreds or even thousands of times that of the sun are considered feasible to apply to solar cells if heat dissipation is adequate and cells can be developed which are long-lived at such conditions.

Significant increases in solar cell efficiency are possible from the use of tandem subcells of different materials, the different materials having different energy bandgaps between their valence electron bands and their conduction bands. A tandem cell is described in U.S. Pat. No. 5,019,177, which is incorporated herein by reference. One of the subcells disclosed in this patent is comprised of indium phosphide. The growth of tandem cells by epitaxial methods in which the subcells are lattice-matched offers the possibility of monolithic structures having minimal defects or dislocations in the crystal lattice which lower the efficiency of the device. Tandem cells having indium phosphide as one of the subcells are particularly attractive, because there are a variety of III-V ternary and quaternary alloys available having differing energy bandgaps which are lattice-matched with indium phosphide. The integrated InP/InGaAs tandem solar cell has a theoretical efficiency greater than 30 percent. Integrated cells having three or more subcells can also be considered, the top subcell having the highest energy bandgap, so as to absorb and convert the shortest wavelength light to electrical energy and allow the longer wavelength light to pass through, and the lowest subcell having the lowest energy bandgap to absorb the longer wavelength optical energy.

Lattice constants of compounds and alloys used to form photovoltaic cells are well-known. When such materials are combined in devices having subcells of the different materials, it is important that the lattice of the different materials have the same lattice constants to within a small difference. This avoids the formation of defects in the crystal structures which can drastically lower the efficiency of the devices. When the term lattice-matched is used herein, it denotes a difference in lattice constants of the materials of not more than about 0.3 percent. Preferably, lattice constants are matched to within about 0.2 percent.

In any tandem cell device having only two contacts, electrical connection must be made between the subcells. Preferably, these intercell ohmic contacts (IOCs) should cause very low loss of electrical power between cells. Therefore, they must have minimal electrical resistance. There are two methods known for making such IOCs— metal interconnects and tunnel junctions (or tunnel diodes). The metal interconnects can provide low electrical resistance, but they are difficult to fabricate, they result in complex processing and can cause substantial loss in the device efficiency. Therefore, tunnel junctions are much preferred, because a monolithic integrated device can be produced having a plurality of subcells with tunnel junctions therebetween. But, the tunnel junctions must satisfy multiple requirements, such as low resistivity, low optical energy losses, and crystallographic compatibility through lattice-matching between top and bottom cell. Most importantly, they should exhibit a high peak current density. All these characteristics should be conserved upon completion of the entire monolithic device.

The use of $In_{0.53}Ga_{0.47}As$ tunnel diodes for interconnecting tandem subcells of a solar cell has been proposed ("An $In_{0.53}Ga_{0.47}As$ Tunnel Diode for Monolithic Multi-junction Solar Cell Applications," Proc. 20th IEEE Photovoltaic Specialist Conference, IEEE, New York, 1988, pp. 771–776). It was suggested that this material offered the possibility of low electrical resistance tunnel diodes, but optical loss could be substantial. Of course, tunnel diodes between subcells should absorb minimal amounts of the incoming optical energy, which allows the maximum amount of solar energy to be converted to electrical energy. It was further suggested that any tunnel junctions of this material be made very thin or be patterned, so as to minimize loss of solar energy in passing between subcells. The use of patterns, which decreases the area available for the tunnel junction, increases the need for a tunnel junction having low resistance and much higher peak current density.

Solar cells having indium phosphide as one of the subcells and indium gallium arsenide phosphide as a second subcell have been described ("Two-Terminal Monolithic InP/InGaAsP Tandem Solar Cells with Tunneling Intercell Ohmic Connections," Proc. 22nd IEEE Photovoltaic Specialists Conference, IEEE, New York, 1991, pp. 381–387). These cells were grown by the process of liquid phase epitaxy (LPE). It was found that, although $In_{0.53}Ga_{0.47}As$ tunnel junctions could offer high peak current densities and low electrical resistance, such tunnel junctions could not be incorporated into tandem solar cells structures because melt-back problems during the LPE growth would not allow InP to be grown on the $In_{0.53}Ga_{0.47}As$ tunnel junction. The tunnel junction to connect these subcells which could be grown by LPE, consisting of InGaAsP, had peak current and resistivity values far less favorable than attained with $In_{0.53}Ga_{0.47}As$ tunnel junctions grown on an InP substrate.

Although indium gallium arsenide tunnel junctions may be prepared with high peak current densities and be lattice-matched with indium phosphide, optical transparency of indium gallium arsenide is low, and it is necessary to prepare very thin tunnel junctions and preferably to pattern the tunnel junction to allow solar energy to pass through to a lower sub-cell of a device. These requirements increase the complexity of forming solar cells and the absorption of optical energy decreases the efficiency of a solar cell.

There is great need for a tandem solar cell having indium phosphide or an indium phosphide alloy in the indium phosphide system as a subcell, another subcell which is lattice-matched to the indium phosphide and having an energy bandgap differing from that of indium phosphide, and a lattice-matched tunnel junction to interconnect the subcells which exhibits high peak current and low resistivity values and is optically transparent. There is also a need for a method to fabricate such a tandem solar cell as a monolithic device under conditions which will form and leave intact the tunnel junction when a subcell is grown on top of the tunnel junction. Preferably, the tunnel junction is formed from indium phosphide, which provides simplicity in forming a tandem solar cell and practically no absorption of optical energy.

SUMMARY OF THE INVENTION

A tandem solar cell having indium phosphide as a subcell and lattice-matched indium gallium arsenide as a subcell and having a lattice-matched tunnel junction comprising doped indium phosphide is provided.

A tunnel junction is provided having effective dopant concentrations, as defined herein, of at least about $10^{18}$ cm$^{-3}$.

A method of growing a subcell which is lattice-matched with indium phosphide on a tunnel junction is provided, the growth temperature being between about 300° and about 600° C.

A method of growing an indium phosphide tunnel junction at a temperature in the range from about 300° C. and about 600° C. is provided.

A method of preparing an indium phosphide single solar cell or an indium gallium arsenide single solar cell using chemical beam epitaxy is provided.

DETAILED DESCRIPTION OF PREFERRED EMBODIMENT

Figure 1:
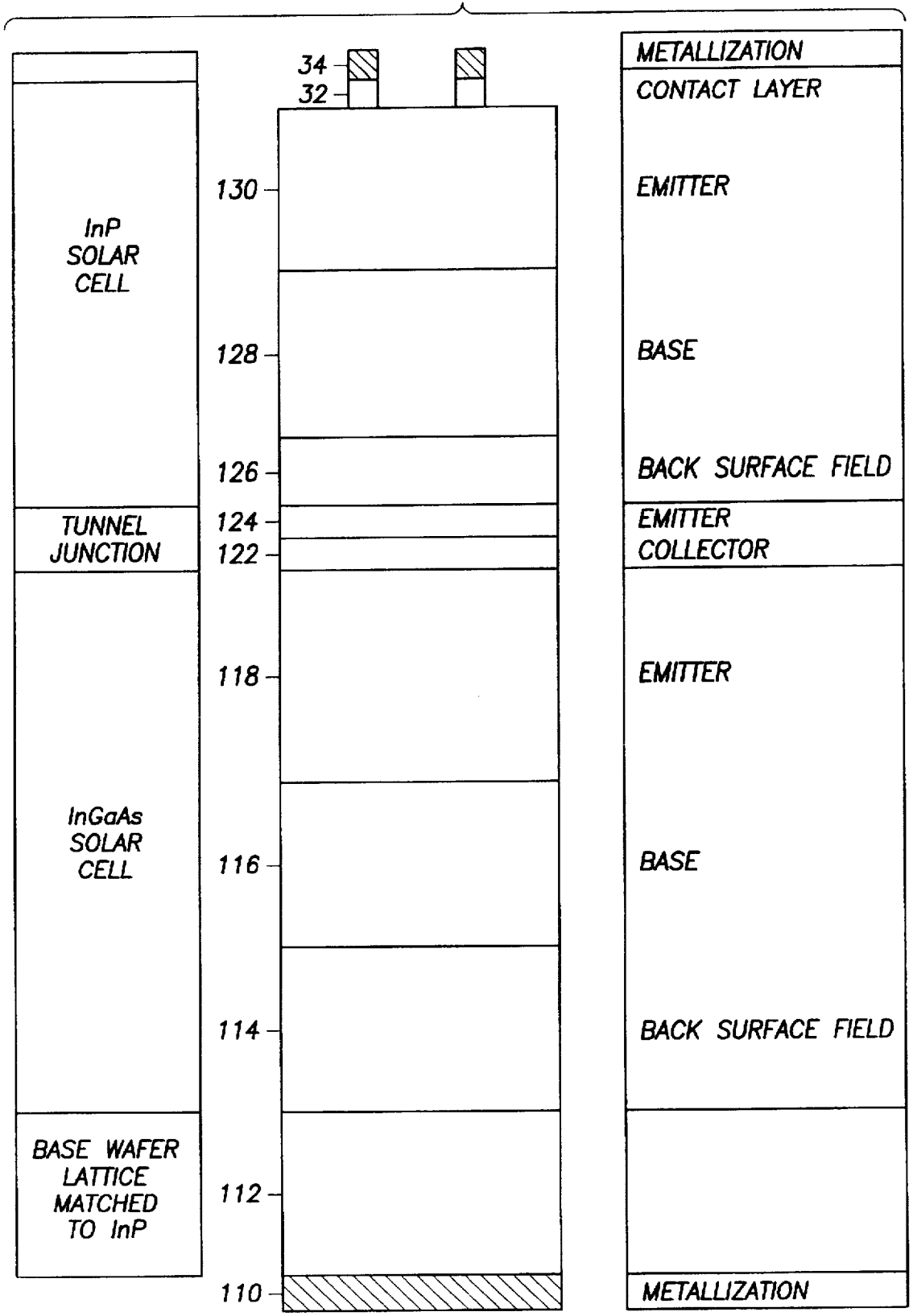
FIG. 1 is a sketch of a tandem solar cell of this invention.

A solar cell fabricated according to this invention is illustrated in FIG. 1. The solar cell is fabricated on substrate 112, the top layer of which is lattice-matched to indium phosphide and the bottom surface of which is back contact 110. Suitable materials well-known in the art may be used as a substrate with buffer layers to accommodate crystal lattice matching requirements between the sub-layer and the top layer of the substrate. A subcell of indium gallium arsenide, consisting of back surface field 114, base 116 and emitter 118, is then provided. Other alloys may be used if lattice-matched with indium phosphide. The subcell is grown by any known technique, such as liquid phase epitaxy (LPE), metal-organic chemical vapor deposition (MOCVD), chemical beam epitaxy (CBE) or other method for growing such material. CBE is a low-pressure (pressure less than 0.01 torr) growth technique using all gas or a combination of gas and solid source precursors. The gases can be either organometallics or hydrides of the elements of the desired alloys and dopants. Solid sources can be metals or metalloids of the desired alloys and dopants.

Figure 2:
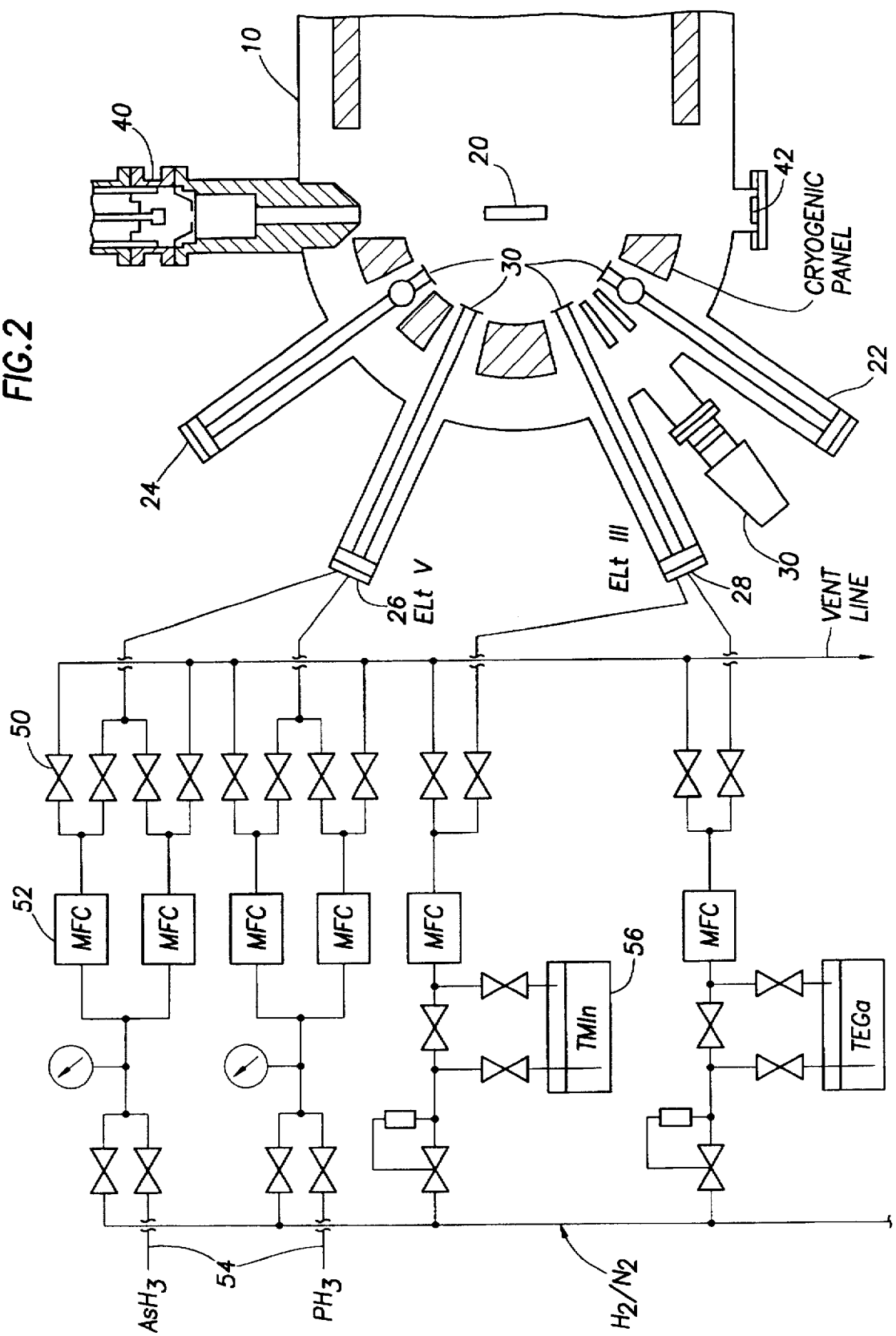
FIG. 2 is a drawing of apparatus suitable for use in the methods of this invention.

Apparatus suitable for use in the method of this invention is shown in FIG. 2. Chamber 10 is designed to provide a vacuum environment. Substrate 20 is disposed in the chamber so as to be available for epitaxial growth from precursor materials provided from solid source containers 22 and 24, from a high temperature channel 26 through which hydride or other gases may enter the chamber, and from a low-temperature channel 28 through which organo-metallic compounds enter the chamber. Pyrometer 30 is placed so as to measure the temperature of the surface of the epitaxial growth. Scanning electron gun 40 and fluorescent screen 42 are used to monitor crystal lattice-matching. Gases are provided to the chamber 10 from sources 54 through mass flow controllers 52 and valves 50. Organo-metallic compounds containing precursor elements are added in bubblers 56 and carried to chamber 10 in hydrogen gas.

In one embodiment of this invention, where a p- on n-type solar cell is realized, a layer of p-InP is grown as a regrowth layer above the lower subcell; an n-InP layer is grown when an n- on p-type solar cell is used for the first. If the lower subcell has been grown in a separate apparatus, it is transferred to a chamber suitable for low-temperature epitaxial growth, such as by chemical beam epitaxy (CBE).

Referring again to FIG. 1, epitaxial growth of the tunnel junction consisting of collector layer 122 and emitter layer 124 is accomplished at temperatures below about 600° C. Metal-organic compounds such as trimethyl-indium (TMI) and triethyl-indium (TEI) are used to provide indium at the required temperatures. Pre-cracked phosphine (PH$_3$) is also employed as growth precursor. Lattice-matching with respect to InP may be analyzed as the tunnel junction is grown. The tunnel junction is preferably grown at substrate surface temperatures in the range from about 300° to 600° C. More preferably, the temperature range is from about 460° C. to about 550° C. Most preferably, the temperature range is from about 480° C. to about 530° C.

Surface temperature is preferably measured by pyrometry, but any accurate method is acceptable. Care must be taken to avoid erroneous measurements from temperature sensors which are not located at the surface of the substrate. The tunnel junction is preferably grown at a growth rate in the range from about 0.1 to 10 microns per hour; more preferably the growth rate is in the range from about 0.1 to about 2 microns per hour; most preferably the growth rate is in the range from about 0.5 and 1.5 microns per hour. These growth rates are also applicable to all the subcells in the tandem device. Lattice matching may be checked by double crystal X-ray diffraction. Desirable pressure range in the chamber depends on precursor compounds used and other factors, but is preferably in the range from about $10^{-7}$ torr to about $10^{-2}$ torr. More preferable, the pressure in the chamber should be between $10^{-5}$ and $5\times10^{-4}$ torr. The pressure measured in the chamber must be representative of the pressure at the substrate location.

After the tunnel junction is achieved, the top subcell, consisting of back surface field 126, base 128 and emitter 130 are epitaxially grown. This subcell is grown by the methods of this invention at a temperature preferably below about 550° C., so as to leave intact the tunnel junction that has been grown. The lower subcell and the tunnel junction may be grown by the methods of this invention or by a method employing temperatures higher than 550° C., but the upper subcell must be epitaxially grown in the temperature range of this invention. Contact layer 132 and front contact 134 are then applied using well-known methods. An anti-reflection coating (not shown) is usually applied over the top of the device.

Although indium phosphide is shown in FIG. 1 as the top sub-cell, it should be clear that alloys in the indium phosphide system that are lattice-matched to indium phosphide may also be used. The following alloys are here considered alloys in the indium phosphide system: AlInAs, GaAsSb, InAsP, AlPSb, GaPSb, GaInAs, GaInAsP, GaInAsSb, AlInAsSb, GaInPSb, AlInPSb, and AlGaPSb. These alloys have somewhat different energy bandgaps, which may be desirable in some applications, and may be used as subcells.

Similarly, indium gallium arsenide as a lower subcell is used herein to include all alloys of indium gallium arsenide with the addition of isovalent elements such as phosphorous, aluminum, and tin in concentrations such that the modifications to the bandgap are less that 0.1 eV compared to $In_{0.53}Ga_{0.47}As$ (E =0.72 eV) and a change in lattice constant such that the lattice mismatch is less than about 0.3 percent.

The tunnel junction may be prepared by doping indium phosphide with a variety of elements, such as n-type doping with sulfur, tellurium, selenium, germanium, tin or silicon and p-type doping with carbon, zinc, cadmium, beryllium or magnesium. Dopant concentrations are realized by controlling the temperature of solid source effusion cells or controlling flowrate with flowmeters when organo-metallic or hydride sources are used as dopant.

It was shown that in the case of doping of indium gallium arsenide that the activation energy of doping resulted in attainability of much higher concentrations of dopant at lower temperatures, that at temperatures below about 550° C. concentrations of dopant could be achieved which led to high peak current densities, as predicted by theory, and that the dopant layers were not destroyed by growth of a layer overlying the tunnel junction if temperature was maintained lower than about 550° C. These measurements were described in U.S. Ser. No. 08/044,941, filed Apr. 8, 1993, now U.S. Pat. No. 5,407,491, which is incorporated by reference herein for all purposes. It has now been discovered that concentrations of dopant can be achieved in indium phosphide which are sufficiently high to also achieve high peak current densities in this material.

Figure 3A:
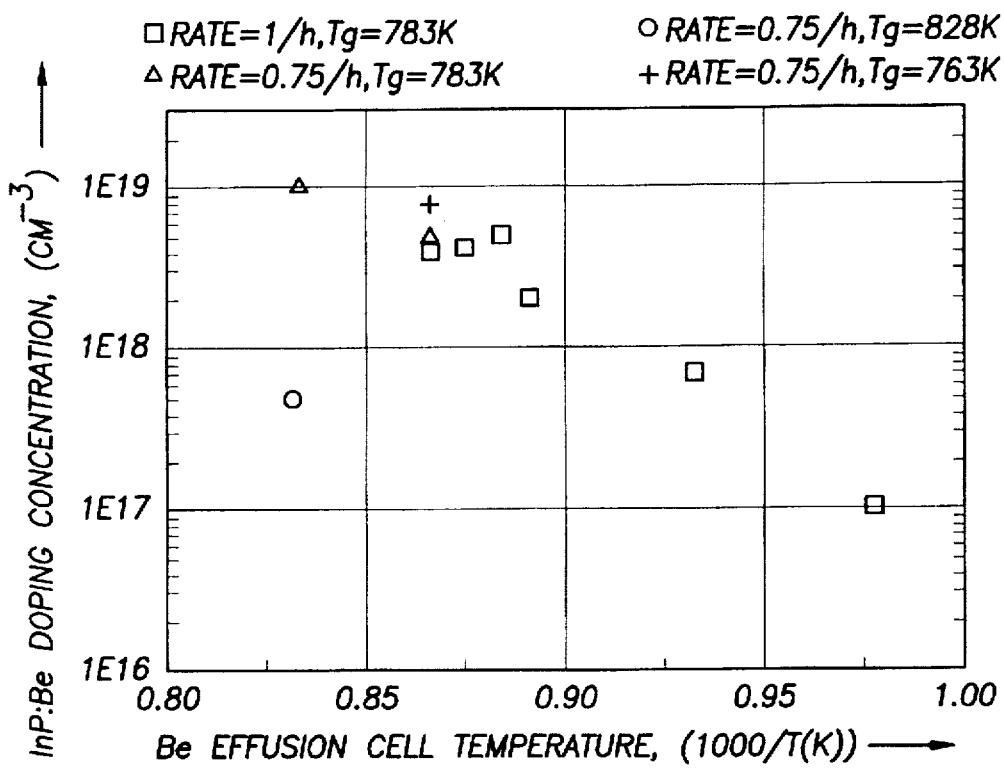
FIGS. 3(a) and (b) are graphs of concentrations of dopants produced at differing temperatures and growth rates by the method of this invention.

Measurements show that the p-type carrier concentrations in indium phosphide are strongly dependent on growth temperature and rate. Lower growth temperature or rates lead to higher carrier concentrations. FIG. 3(a) shows beryllium doping concentrations as a function of effusion cell temperature at different growth rates and growth temperatures. The solid squares represent samples grown at a temperature growth of 783° K (510° C.) and with a growth rate of 1 micron per hour. The open triangles represent samples grown at the same growth temperature and a growth rate of 0.75 micron per hour. The open circles represent samples grown at a growth temperature of 828° K (555° C.) and a growth rate of 0.75 micron per hour. The crosses represent samples grown at a growth rate of 783° K (510° C.) and a growth rate of 0.75 micron per hour. It can be noticed that the carrier concentration is more sensitive to growth temperature than to growth rate changes. If the growth temperature decreases by 45° K, the doping level increases very significantly.

Figure 3B:
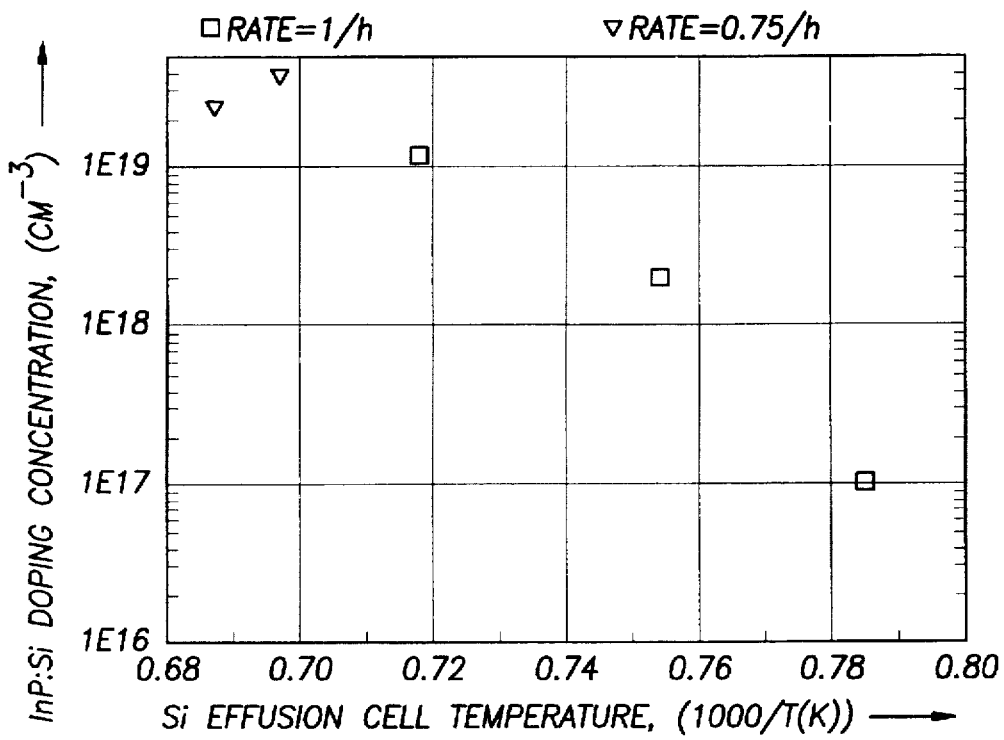

FIG. 3(b) shows similar data from a silicon effusion cell temperature. The solid squares represent samples grown at a rate of 1 micron per hour and the open triangles represent samples grown at a rate of 0.75 microns per hour. Electron concentrations are found to be insensitive to either the growth temperature or the growth rate.

An unexpected behavior was observed for beryllium incorporation into the indium phosphide layers. Above a beryllium source temperature of about 880° C., a strong decrease of carrier concentration, as indicated by Hall measurements, was observed. Results show that an upper limit exists on the temperature at which the beryllium source should be maintained when doping of the indium phosphide is occurring by the methods of this invention. This temperature limit is believed to be in the range of 880° C.

Figure 4:
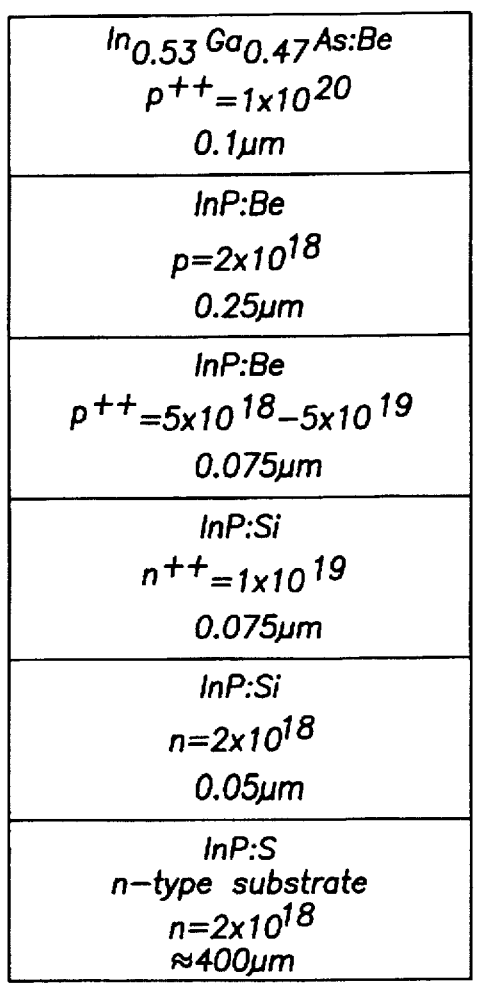
FIG. 4 is a sketch of a device grown in the laboratory to measure the peak current of the tunnel junction of this invention.

To determine peak current densities attainable with a tunnel junction of doped indium phosphide grown by the methods of this invention, a test device with layer thicknesses shown in FIG. 4 was formed. First, a thin buffer layer consisting of indium phosphide doped with silicon was grown on a sulfur-doped indium phosphide substrate to form a base for the tunnel junction. Epitaxial growth runs were accomplished in the system of FIG. 2 using trimethylindium (TMI), triethyl gallium (TEG) and pre-cracked arsine and phosphine as growth precursors. Solid beryllium and silicon were used as doping sources for p- and n-type, respectively. To investigate the tunnel junction characteristics for tandem solar cells applications, all tunnel junctions had a p-type indium phosphide overlayer with the same thickness (0.25 micron) as the indium phosphide top subcell expected to be used in a solar cell, as determined by theoretical modeling. The growth was terminated with a highly doped indium gallium arsenide layer which served as a contact layer, as shown in FIG. 4.

Since it is well known that the major problem in the fabrication of indium phosphide tunnel junctions is the realization of high p-type doping levels, the n-type (silicon doped) concentration was maintained constant at about $1 \times 10^{19}$ cm−3 and a thickness of about 750 angstroms. This layer was formed at a growth temperature of 510° C. and at a growth rate of 1 micron per hour.

Figure 5:
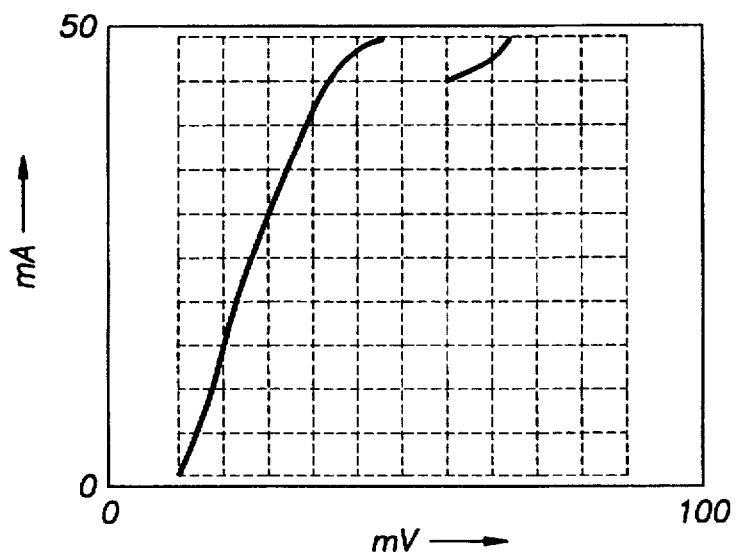
FIG. 5 is a graph of current vs. voltage for the device of FIG. 4.

A tunnel junction was grown and tested in accord with the data provided in FIG. 3 in which the beryllium-doped layer was deposited under a growth temperature of 510° C., a rate of growth of 0.75 micron per hour and a temperature of the beryllium source of 880° C. The current vs. voltage characteristics of the tunnel junction were then measured and the results are shown in FIG. 5. The surface area of the device was $3.14 \times 10{-4}$ cm$^2$. Analysis of the curve results in a measured peak current density of 1600 amperes per cm$^2$.

By the methods of this invention, large values of peak current were obtained because of the fact that high dopant concentrations were achieved, as explained in U.S. Ser. No. 08/044,941. Peak current densities will depend on dopant concentrations, and the concentration of p-type dopant will normally be a limitation on peak current densities. A range of current densities can be achieved, but densities should normally be such that peak current density will be greater than about 50 amperes per cm$^2$. Other tunnel junctions may be grown having current densities greater than about 200 amperes per cm$^2$. The maximum current density measured, as reported above, was 1600 amperes per cm$^2$, but values even greater than this are believed possible by methods of this invention. Although the p-type material of the tunnel junctions was grown at a temperature of 510° C., it is believed that growth temperatures of at least from about 450° C. to about 550° C., are possible. The most preferable temperature range is 500°–520° C., but the temperature can be as low as about 300° C. and as high as about 600° C. During the growth, the pressure in the chamber was in the range of $10^{-5}$ to $10^{-4}$ torr, which is the most preferable range. Preferably, the pressure is in the range from about $10^{-6}$ torr to about $5\times10^{-4}$ torr, but the pressure can be as low as about 10–7 torr and as high as about 10–2 torr.

Resistivity of the tunnel junction described above was below $1\times10^{-4}$ ohm-cm-2. This value is based on peak current density and voltage. Resistivity is likely to be lower than this value in the operating range of current density and voltage between the subcells of a photovoltaic device.

The high transmissibility of light through indium phosphide provides a major advantage of the tunnel junction of this invention and the method of forming. Optical energy absorption of indium gallium arsenide is such that about 80 percent of the energy is absorbed in a thickness of about 3000 angstroms. With such absorbance, it is obvious that very small thicknesses are necessary to prevent complete absorption of light for wavelengths shorter than 1.5 micrometers in the area where the tunnel junction exists. (For longer wavelengths the InGaAs junction is totally transparent.) But with the indium phosphide tunnel junction of this invention, thickness is not a critical limitation and it is not necessary to pattern the tunnel junction to decrease energy loss. To produce a pattern during fabrication of a tandem device, a stop-etch layer is grown over the lower subcell. The tunnel junction is then grown on the stop-etch layer. A resist is then applied in the pattern desired, using well-known techniques, and the tunnel material is etched. These steps can be eliminated by the method and material of this invention.

The lowest value of temperature which is suitable for growth of such devices is determined by growth kinetics and crystal quality. It is believed that a practical lower limit of temperature is about 300° C. The upper temperature limit for growth of the top cell of this invention is controlled by interdiffusion of the doping species across the tunnel junction active region and the deterioration of the junction characteristics. The upper temperature limit is believed to be about 600° C.

A tunnel junction may be grown on a subcell at a temperature higher than the temperature range suitable for practice of this invention. To avoid destroying the properties of the tunnel junction, the method of this invention is then employed for growing the top subcell.

Single solar cells of indium phosphide were grown using the method of this invention. A back surface field having a thickness of about 1 micron was grown. Silicon dopant concentration was at least about $2\times10^{18}$ cm$^{-3}$. Growth temperatures were in the range from about 490° to about 550° C. A base layer having thickness in the range from about 1 to 5 microns was then grown. Silicon dopant concentrations were in the range of 0.4 to $5\times10^{17}$. Growth temperatures were in the range from 490° to 550° C. An emitter layer having thickness in the range from about 0.1 to 0.6 microns was then grown. Beryllium concentrations were in the range of 1 to $5\times10^{18}$ cm$^{-3}$. Growth temperatures were in the range from 490° to 550° C. A contact layer was then grown. The contact layer thickness was from 0.1 to 0.5 microns. Beryllium concentrations were greater than $10^{18}$ per cm$^{-3}$. Growth temperatures were in the range of 460° to 530° C. A metalization layer was then added using standard techniques.

Single solar cells of indium gallium arsenide were also fabricated using the methods of this invention. A back surface field layer was grown having thickness greater than 0.1 micron, and usually significantly thicker. Silicon dopant concentrations were greater than $10^{18}$ cm$^{-3}$. Temperatures were in the range from 500° to 530° C. A base layer was then grown to a thickness from 2 to 4 microns. Silicon dopant concentrations were from 0.8 to $2\times10^{17}$ cm$^{-3}$. Temperatures were in the range from 460° to 530° C. An emitter layer was then grown to thickness in the range from 0.3 to 0.5 micron. Beryllium concentrations were from 1 to $3\times10^{18}$ cm$^{-3}$. Temperatures were in the range from 500° to 530° C. A window of indium phosphide was then grown to a thickness of 0.03 to 0.05 microns using the same range of concentrations of beryllium and of temperature.

It should be understood that n- and p-type layers described in this invention are reversible, i.e., the sequence can begin with either type and a change to the other type can occur at a homojunction or interface between layers.

EXAMPLE 1

An indium gallium arsenide subcell is grown on a base wafer which is lattice-matched to indium phosphide. An indium phosphide tunnel junction is then grown on the subcell, the tunnel junction having an effective beryllium dopant concentration of $5\times10^{18}$ cm$^{-3}$, in apparatus such as shown in FIG. 2 under preferred conditions set out herein. An optimized indium phosphide subcell is grown on the tunnel junction under preferred conditions set out herein. The usual contact layer and front contact are added. The substrate is provided with a suitable back contact. An anti-reflective coating is applied using well-known techniques.

The efficiency of the cell is measured to be 31 percent at 1 sun and 34 percent at 1000 sun intensity. The voltage drop due to the tunnel junction, which absorbs a negligible amount of the optical energy passing from the upper to the lower subcell and has a peak current density of 1600 amperes cm$^{-2}$ and a resistivity of $1\times10^{-4}$ ohm cm$^2$, is only $3.2\times10^{-6}$ volt when the tandem device is producing a current of 30 amperes and 1.25 volt. The decrease in efficiency of the device from electrical loss in the tunnel junction is only 1.5 percent, whereas a prior art device, having a peak current of 28 amperes cm$^{-2}$, would not allow such high currents to pass the tunnel junction. The maximum allowed current of the tandem cell fabricated with the prior art tunnel device is 1.4 amperes cm$^{-2}$ with a voltage drop of 0.4 volt. The decrease in efficiency of such a tandem device fabricated with the prior art tunnel junction is expected to be more than 95 percent of the sum of the efficiencies of the individual subcells.

The invention has been described with reference to its preferred embodiments. Those of ordinary skill in the art may, upon reading this disclosure, appreciate changes or modifications which do not depart from the scope and spirit of the invention as described above or claimed hereafter.

What is claimed is:

1. A two-terminal, monolithic, tandem photovoltaic, device, comprising:
   a substrate having an upper and lower surface;
   a first photoactive subcell on the upper surface of the substrate, the first subcell comprising a semiconductor material lattice-matched to the top layer of the substrate and having an energy bandgap;
   a second photoactive subcell above the first subcell, the second subcell comprising a material lattice-matched to the first subcell and having a different energy bandgap than the first subcell; and
   a tunnel junction, the tunnel junction comprising doped indium phosphide, interconnecting the first and second subcells, the tunnel junction being lattice-matched to the first and second subcells and having a peak current density greater than 50 amperes $cm^{-2}$.

2. The device of claim 1 wherein the first subcell is comprised of indium gallium arsenide.

3. The device of claim 1 wherein the second subcell is comprised of indium phosphide.

4. The device of claim 1 wherein the dopants for the tunnel junction are selected from the group of n-type dopants consisting of sulfur, tellurium, selenium, germanium, tin, and silicon and the group of p-type dopants consisting of carbon, zinc, cadmium, beryllium, and magnesium.

5. The device of claim 1 wherein the dopants for said tunnel junction are silicon and beryllium.

6. The device of claim 1 wherein the peak current density of said tunnel junction is greater than 50 amperes $cm^{-2}$.

7. A method for preparing a two-terminal, monolithic, tandem photovoltaic cell, comprising the steps of:

providing a substrate having a top layer lattice-matched with indium phosphide; phosphide;

providing on said substrate a first subcell lattice-matched to the top layer of the substrate;

epitaxially depositing on the first subcell a tunnel junction, the tunnel junction comprising doped indium phosphide; and epitaxially depositing on the tunnel junction a second subcell comprising indium phosphide, the deposition of the second subcell being at a surface temperature in the range from about 300° C. to about 600° C.

8. The method of claim 7 wherein the surface temperature is in the range from about 460° C. to about 550° C.

9. The method of claim 7 wherein the surface temperature is in the range from about 480° C. to about 530° C.

10. The method of claim 7 wherein the first subcell is comprised of indium gallium arsenide.

11. The method of claim 7 wherein the second subcell is comprised of indium phosphide.

12. The method of claim 7 wherein the second cell is deposited using chemical beam epitaxy.

13. The method of claim 7 wherein the tunnel junction is deposited using chemical beam epitaxy.

14. The method of claim 7 wherein the first subcell is deposited using chemical beam epitaxy.

15. The method of claim 7 wherein the first subcell, the tunnel junction, and the second subcell are deposited using chemical beam epitaxy.

16. The method of claim 7 additionally comprising the steps of depositing a tunnel junction and a third subcell on top of the second subcell.

17. A device including an indium phosphide tunnel junction, comprising:

two subcells formed on opposite sides of the tunnel junction;

a first subcell of indium gallium arsenide on one side of the tunnel junction;

an n-type dopant for said tunnel junction selected from the group of elements consisting of sulfur, tellurium, selenium, germanium, tin, and silicon and a p-type dopant for said tunnel junction selected from the group of elements consisting of carbon, zinc, cadmium, beryllium, and magnesium, the dopant concentrations being greater than $10^{18}$ atoms per $cm^{-3}$.

18. The device of claim 17 wherein the peak current density of the tunnel junction is greater than 200 amperes per $cm^2$.

19. A method of forming a tandem photovoltaic device including an indium phosphide tunnel junction, comprising the steps of:

providing a first subcell;

providing precursor elements of tunnel junction-forming materials;

growing the tunnel junction on the surface of said first subcell at a surface temperature in the range from about 300° C. to about 600° C. and a pressure in the range from about $10^{-7}$ torr to about $10^{-2}$ torr.

20. The method of claim 19 wherein at least one of the precursor elements is provided in an organo-metallic compound.

21. The method of claim 19 wherein the tunnel junction is allowed to grow at a surface temperature in the range from about 480° C. to about 530° C.

* * * * *